United States Patent [19]
Manley et al.

[11] Patent Number: 5,757,298
[45] Date of Patent: May 26, 1998

[54] METHOD AND APPARATUS FOR ERROR COMPENSATION USING A NON-LINEAR DIGITAL-TO-ANALOG CONVERTER

[75] Inventors: Robert B. Manley; David L. McAllister, both of Fort Collins, Colo.

[73] Assignee: Hewlett-Packard Co., Palo Alto, Calif.

[21] Appl. No.: 609,078

[22] Filed: Feb. 29, 1996

[51] Int. Cl.$^6$ .................................. H03M 1/84
[52] U.S. Cl. .................. 341/138; 341/118; 341/144
[58] Field of Search ........................ 341/118, 120, 341/121, 131, 138, 140, 144

[56] References Cited

U.S. PATENT DOCUMENTS

| | | | |
|---|---|---|---|
| 4,594,576 | 6/1986 | Fujii | 340/347 AD |
| 4,740,776 | 4/1988 | Sloane | 340/347 AD |
| 4,947,172 | 8/1990 | Suzuki | 341/145 |
| 5,001,480 | 3/1991 | Ferry et al. | 341/108 |
| 5,038,204 | 8/1991 | Wan et al. | 358/21 R |
| 5,198,814 | 3/1993 | Ogawara et al. | 341/118 |
| 5,298,898 | 3/1994 | Brunheim | 341/118 |

OTHER PUBLICATIONS

"HP Color Recovery Technology", Anthony C. Barkans; Hewlett-Packard Journal, Apr. 1995, pgs51–59.
"Fundamentals Of Interactive Computer Graphics", James D. Foley and Van Dam;Addison–Wesley Systems Programming Series, pgs. 596–603.

*Primary Examiner*—Jeffrey A. Gaffin
*Assistant Examiner*—Jason L. W. Kost
*Attorney, Agent, or Firm*—Kevin M. Hart

[57] ABSTRACT

A non-linear digital-to-analog converter (non-linear "DAC") and method are disclosed for scaling a digital input value by a non-integer and producing an analog output. The digital input value is multiplied by a non-integer, and the integer portion of the result is fed to a linear DAC to produce a linear analog output. At least one of the bits of the integer portion of the result is decoded, and at least one compensation value is generated responsive to the decoding. The compensation value is added to the linear analog output and represents the fractional portion of the result of scaling the digital input value by the non-integer. A method is also disclosed for utilizing the non-linear DAC for error compensation in a computer graphics system. Color intensity values are scaled up by a non-integer greater than one. A first analog output is generated proportional to the integer portion of the result. At least one bit of the integer portion of the result is decoded, and a second analog output is generated responsive to the decoding. The second analog output represents the fractional portion of the result. The first and second analog outputs are combined, and the combined analog output is used to drive a display device.

29 Claims, 5 Drawing Sheets

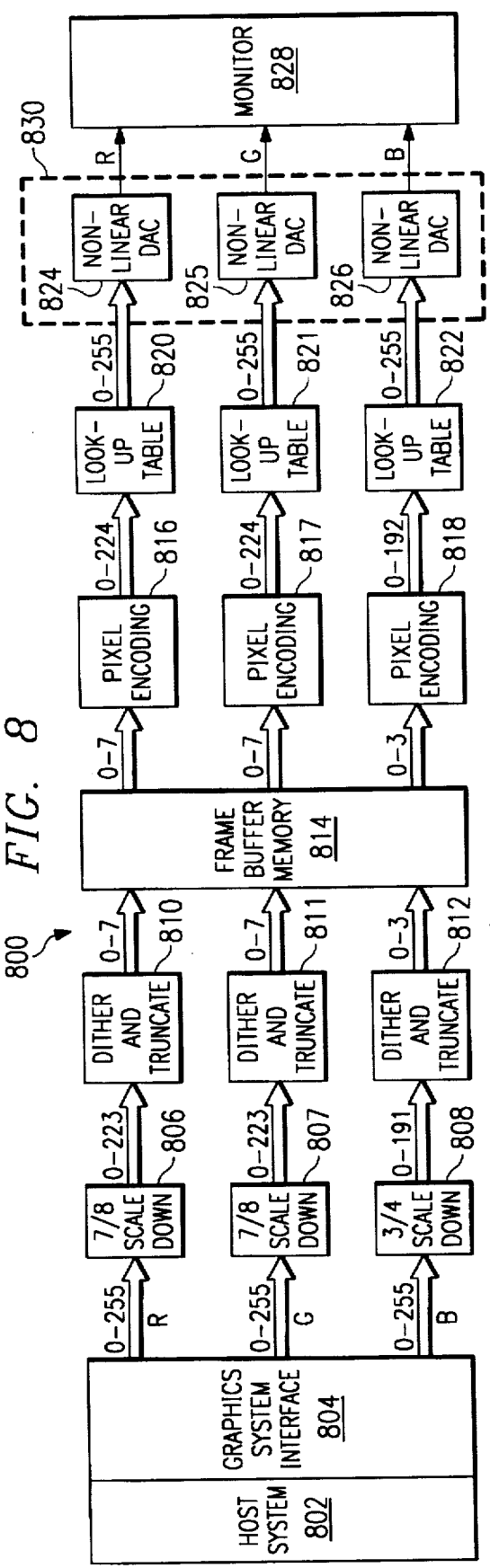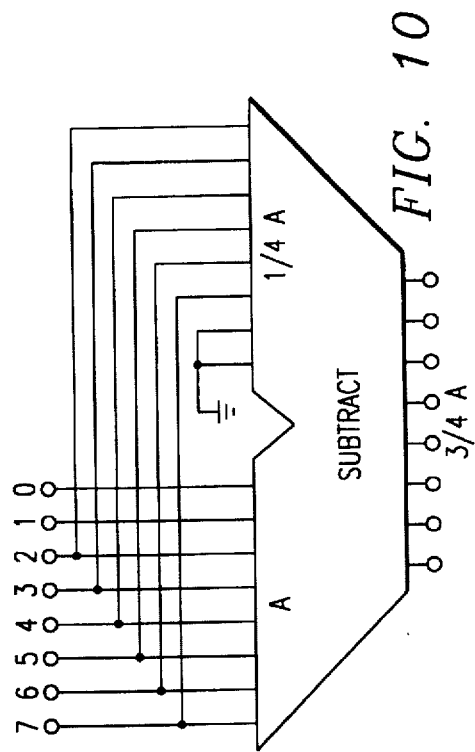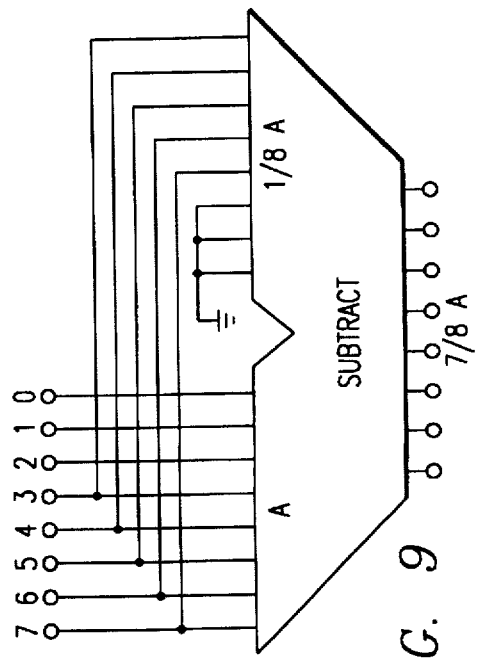

METHOD AND APPARATUS FOR ERROR COMPENSATION USING A NON-LINEAR DIGITAL-TO-ANALOG CONVERTER

FIELD OF THE INVENTION

This invention relates generally to digital-to-analog converters. More specifically, the invention relates to using a non-linear digital-to-analog converter ("non-linear DAC") to compensate for non-linearities that are introduced when DAC input data are scaled by a non-integer before application to the DAC. The invention finds particular application in computer graphics systems.

BACKGROUND

In modern computer graphics systems, graphics information and commands are generally produced by a host processor and then passed to a graphics system for further processing and display. In turn, the graphics system generally includes a random access memory ("RAM"), known as a frame buffer, in which pixel information is stored. Typically, a display subsystem continually reads the frame buffer and displays the stored information, pixel by pixel, on a raster display device such as a cathode ray tube ("CRT"). By writing desired pixel information to the various addresses within the frame buffer, the host processor and graphics system can thus dictate the contents and appearance of the continuously-updated display.

A large frame buffer can enhance the performance of such a graphics system. For example, a larger RAM means that more pixel data can be stored in the frame buffer at a given time, thus enabling higher resolution displays. Similarly, the more bits per pixel that can be stored in the frame buffer, the more colors that can be displayed. A large frame buffer allows many colors to be displayed at a high level of spacial resolution.

Unfortunately RAM is not only expensive, but is also taxing in terms of power, bandwidth and board space. Therefore, there are practical limits on the size of the frame buffer available for most applications such as those in personal computers. While software even in a personal computer may perform graphics calculations in "true color" mode using 24 bits per pixel—8 bits red, 8 bits green and 8 bits blue, only high-end graphics systems actually store 24 bits per pixel in the frame buffer. The more common solution for lower-end systems is to use 8 bits per pixel in the frame buffer. In a typical 8-bit system, 3 bits per pixel represent red, 3 bits represent green and 2 bits represent blue. (Two bits are allocated to blue rather than three because the human eye is less sensitive to differences in blue colors than it is to differences in red and green colors.) While the 8-bits-per-pixel solution successfully reduces the size and cost of the frame buffer, it does so at the expense of color resolution and image quality. One reason for this is because color intensity information is necessarily lost when 8-bit color intensity values are truncated to 3 or 2-bit numbers for storage in the frame buffer.

Consequently, additional processing is frequently employed in such systems to lessen the deleterious effect of truncating color intensity values. One well-known technique used for this purpose is dithering. Dithering in this context involves adding noise to each 8-bit color intensity value prior to its truncation. Generally, the noise value that is added to a particular color intensity value is a predetermined function of the address in the frame buffer to which the color intensity value is destined. For example, a dithering matrix having 2 rows and 16 columns ("2×16") may be defined containing 32 different noise values, one in each position of the matrix. For an X-column by Y-row frame buffer, as each new color intensity value is sent through the dithering process, the 4 least significant bits of the X address and the 1 least significant bit of the Y address are checked in the value's destination frame buffer address, and a corresponding noise value from the dithering matrix will be added to the color intensity value. In this manner, the pattern of the dithering matrix will effectively be repeated many times across the total image to be displayed, although each color intensity value in the image will have been mapped to (and added to) only one of the noise values in the repeated 32-value dithering matrix. After dithering and truncation is completed, some of the color intensity values will be higher—and some lower if negative numbers are included in the dithering matrix—than they would have been had they been truncated without the addition of the noise values. The overall effect of the dithering process is analogous to halftone approximation: The number of color intensity levels actually displayed is apparently increased due to the natural blending operation performed by the human eye, especially if the display is viewed from a distance. A more detailed explanation of dithering may be found in J. D. Foley and A. Van Dam, *Fundamentals of Interactive Computer Graphics*, 597–602 (Addison-Wesley, 1982), which pages are incorporated herein by reference.

While dithering relies on the blending operation of the human eye to produce an apparent increase in color resolution, other techniques are sometimes employed in combination with dithering in an attempt to bring "true color" capabilities to 8-bit graphics devices. Such techniques will be referred to generally herein as "pixel encoding" techniques. One such technique is know as color recovery. The goal of color recovery when employed in combination with dithering is basically to cause the computer graphics system itself to accomplish the blending operation that, without color recovery, must be performed by the human eye. Thus, the effect of color recovery is that the user of the graphics system does not have to view the displayed image from a distance in order to see the benefits of the dithering process. (A more detailed description of color recovery may be found in Anthony C. Barkans, "HP Color Recovery Technology," *Hewlett-Packard Technical Journal* (April, 1995), which article is incorporated herein by reference.) By way of example, a color recovery "filter" may be defined having a 2×16 pixel window. During the process of retrieving the image from the frame buffer for display, the 2×16 window may be moved across the entire image, pixel by pixel. The benefit of this process is that the color intensity value for each pixel may be compared with those of its neighboring pixels within the window and adjusted accordingly.

Consider a 3-3-2 system, in which the red color intensity value for a given pixel upon retrieval from the frame buffer might be any number from 0 to 7. Suppose that the red value for the pixel being processed at the moment happens to be 5. Suppose further that the red value for all of the other neighboring pixels within the 2×16 window also happens to be 5. The color recovery process will find the sum of all red values for the 32 pixels within the window and will assign that sum to the pixel being processed. Thus, a value of 160 will be assigned to the red value for the pixel being processed. On the other hand, suppose that the red values for half of the pixels in the window happened to be 2, and that the red values for the other half of the pixels in the window happened to be 3. (Assume that the values are distributed so that no edge is present.) The sum of the red values in the 32-pixel window would be 80. Thus, a red value of 80 would be assigned to the pixel being processed. (If an edge is detected within the window, values on the side of the edge opposite the pixel being processed may be replaced with other values prior to the summing operation in order to avoid smearing the edge.)

It can be seen from this discussion that, in a 3-3-2 graphics system using the color recovery process just discussed, the maximum intensity value for red or green on the output of color recovery would be 224, and the maximum value on the output of color recovery for blue would be 96. This is because, in a 3-3-2 system, only 3 bits are stored in the frame buffer for red or green, and only 2 bits are stored for blue. The maximum number that can be represented by 3 bits is 7, and the maximum number that can be represented by 2 bits is 3. For red and green, then, the maximum value that can be placed in each pixel of the 32-pixel color recovery filter is 7. Summing over these 32 pixels in the color recovery filter would yield a maximum value of 224 for red or green on the color recovery output. For blue, the case is similar: Because only 2 bits are stored in the frame buffer, the maximum value that can be stored in each pixel of the 32-pixel color recovery filter would be 3. Summing over these 32 pixels in the color recovery filter would yield a maximum value of 96 for blue on the color recovery output. (In practice, the color recovery output for blue may be shifted one bit to the left, thereby doubling the maximum output from 96 to 192 in order to more closely approximate the desired output range of 0–255.)

In short, the result of this problem is a decrease in the dynamic range available to represent color intensities. "True color" pixel intensities are initially supplied as input to the graphics system, each intensity having a range of potential values from 0–255 for red, green and blue. After dithering, truncation and color recovery, however, the range of potential values for red and green is only 0–224, and the range of potential values for blue is only 0–96 (or 0–192 after shifting the blue values one bit to the left). In each case, a significant and contiguous portion of the initial "true color" 0 to 255 dynamic range is lost. This problem becomes manifest when the color recovery outputs are used to supply the inputs to the 8-bit DACs that drive the display: Only a portion of the full input range of each DAC is used, resulting in degraded color performance. The challenge then becomes, how can these reduced ranges be used to drive an 8-bit DAC over its full output range in a linear fashion when a full DAC output would require inputs that range from 0–255?

Several attempts have been made to address this problem in graphics systems with the use of look-up tables. For the sake of simplicity of illustration, each of these prior solutions will now be described assuming that we have an input range of only 0–10, that we wish to use them to drive a 4-bit DAC whose full input range is from 0–15, and that we wish to achieve the full output range of the DAC in a linear fashion. (This illustration is to be analogized to the actual problem described above in which we have an input range of 0–192 or 0–224 and the desire is to drive an 8-bit DAC linearly over its full output range of 0–255.)

A first prior solution has been to use a look-up table to re-map the reduced input range of 0–10 to the full range of 0–15 before applying it to the DAC input. To do so, the input range must be scaled by 3/2, a non-integer. This solution is illustrated in Table 1 below.

TABLE 1

| Original Value | Desired Value | Mapped Value | Step Size | Error |
|---|---|---|---|---|
| 0 | 0 | 0 | | 0 |
| 1 | 1.5 | 1 | 1 | −0.5 |
| 2 | 3 | 3 | 2 | 0 |
| 3 | 4.5 | 4 | 1 | −0.5 |
| 4 | 6 | 6 | 2 | 0 |
| 5 | 7.5 | 7 | 1 | −0.5 |
| 6 | 9 | 9 | 2 | 0 |
| 7 | 10.5 | 10 | 1 | −0.5 |
| 8 | 12 | 12 | 2 | 0 |
| 9 | 13.5 | 13 | 1 | −0.5 |
| 10 | 15 | 15 | 2 | 0 |
| Sum of Squares Error | | | | 1.25 |

As can be seen from the "Mapped Value" column of Table 1, all digits to the right of the decimal point are suppressed in an integer-based system. Thus, scaling the input range by 3/2 introduces non-linearities into the result: The output step size is very non-uniform, varying from 1 to 2, and the resulting sum of squares error is 1.25.

To apply the scaling solution to the 8-bit graphics systems described above would require that the blue input range of 0–192 be multiplied by 4/3 (a non-integer) to yield the desired range of 0–255. Similarly, the red and green input ranges of 0–224 would have to be multiplied by 8/7 (also a non-integer) to yield the desired range of 0–255. Because the 8-bit graphics system is integer-based, the same problems found in the example would therefore result: error and non-uniform step size.

A second prior solution has been to avoid rescaling the inputs at all, and instead simply to translate the outputs in order to minimize the visible effects of the lost dynamic range. Using this technique, the error may be allocated to the top of the output scale, to the bottom of the output scale, or evenly distributed between the top and the bottom of the output scale. Each of these solutions is illustrated below in Table 2 as Mapped Values "A," "B" and "C," respectively.

TABLE 2

| Original Value | Desired Value | Mapped Value A | Error A | Mapped Value B | Error B | Mapped Value C | Error C |
|---|---|---|---|---|---|---|---|
| 0 | 0 | 0 | 0 | 5 | +5 | 2 | +2 |
| 1 | 1.5 | 1 | −0.5 | 6 | +4.5 | 3 | +1.5 |
| 2 | 3 | 2 | −1 | 7 | +4 | 4 | +1 |
| 3 | 4.5 | 3 | −1.5 | 8 | +3.5 | 5 | +0.5 |
| 4 | 6 | 4 | −2 | 9 | +3 | 6 | 0 |
| 5 | 7.5 | 5 | −2.5 | 10 | +2.5 | 7 | −0.5 |
| 6 | 9 | 6 | −3 | 11 | +2 | 8 | −1 |
| 7 | 10.5 | 7 | −3.5 | 12 | +1.5 | 9 | −1.5 |
| 8 | 12 | 8 | −4 | 13 | +1 | 10 | −2 |
| 9 | 13.5 | 9 | −4.5 | 14 | +0.5 | 11 | −2.5 |
| 10 | 15 | 10 | −5 | 15 | 0 | 12 | −3 |
| Sum of Squares Error | | | 96.25 | | 96.25 | | 30.25 |

As Table 2 demonstrates, the "A" mapping is the identity function. It might be chosen to avoid having to use a look-up table, or if the application tolerates error better at the high end of the output scale than at the low end. The "B" mapping, on the other hand, allocates the error to the low end of the output scale and would require a look-up table to implement. The "C" mapping attempts to distribute the error evenly between the high and low ends of the output scale. It results in lower total error than the "A" and "B" mappings and produces the most accuracy near the center of the output range. Each of these three solutions preserves linearity to the extent that the output step size remains constant, but each also produces much greater total error than does the scaling solution of Table 1.

Applying the data translation solution to the 8-bit graphics system described above produces the same problems. Although the step size is made uniform, the error remains significant—at least 15 units at the end of the scale, and possibly as high as 31. Errors of this magnitude equate to $\frac{1}{8}$ of the total range for red and green values and are even more severe in the case of blue.

A third prior solution has been to use a DAC with more inputs (higher resolution) to generate the same range of outputs. For example, Table 3 below illustrates the result of using a 5-bit DAC in place of the 4-bit DAC used in Tables 1 and 2.

TABLE 3

| Original Input Value | Re-Mapped Input Value (DAC Input) | Equivalent DAC Output Value | Desired Value | Step Size | Error |
|---|---|---|---|---|---|
| 0 | 0 | 0 | 0 |  | 0 |
| 1 | 3 | 1.5 | 1.5 | 1.5 | 0 |
| 2 | 6 | 3 | 3 | 1.5 | 0 |
| 3 | 9 | 4.5 | 4.5 | 1.5 | 0 |
| 4 | 12 | 6 | 6 | 1.5 | 0 |
| 5 | 15 | 7.5 | 7.5 | 1.5 | 0 |
| 6 | 18 | 9 | 9 | 1.5 | 0 |
| 7 | 21 | 10.5 | 10.5 | 1.5 | 0 |
| 8 | 24 | 12 | 12 | 1.5 | 0 |
| 9 | 27 | 13.5 | 13.5 | 1.5 | 0 |
| 10 | 30 | 15 | 15 | 1.5 | 0 |
| Sum of Squares Error |  |  |  |  | 0 |

As Table 3 illustrates, this third solution achieves the desired results with perfect linearity and no error. But, this solution creates two additional problems: First, a 5-bit DAC is exponentially more complex and costly than a 4-bit DAC. Second, this solution requires a wider data path for all components and processing between the output of the look-up table and the input of the DAC. These two problems have an even greater impact in the case of the 8-bit graphics system described above: To get a commensurate improvement in performance in the 8-bit system, the designer must choose an 11 or 12-bit DAC and an 11 or 12-bit data path over an 8-bit DAC and an 8-bit data path. In most cases, the added complexity and expense associated with the larger DAC and the wider data path are prohibitive.

Therefore, a need exists for a more efficient method and apparatus for linearly producing a full dynamic range of DAC outputs when the range of available inputs is smaller than the full range of possible DAC inputs, and when re-mapping the available input values to the full DAC input range would require scaling the inputs by a non-integer.

SUMMARY OF THE INVENTION

In one embodiment, the invention includes a method for scaling a digital input value by a non-integer and producing an analog output. The method involves generating and adding together two analog values, one representing the integer portion of the scaled digital input value, and the other representing the fractional portion of the scaled digital input value. First, an integer value is generated to represent the integer portion of the result of multiplying the digital input value by the non-integer. Then, a first analog output is produced that is linearly proportional to the integer value. Simultaneously, the integer value is decoded, and a second analog value is produced responsive to the decoding. The second analog value is a compensation value representing the fractional portion of the scaled digital input value. The compensation value is added to the first analog value to produce the final analog output.

In another embodiment, the invention includes a device for performing digital-to-analog conversion of an n-bit input value in a non-linear fashion. The device includes a means, responsive to each of the n bits of the input value, for producing a linear analog output proportional to the input value. The device also includes a decoder circuitry, coupled to some or all n bits of the input value, for identifying certain states. The decoder circuitry, in turn, controls a means for altering the linear analog output so that, when any of the certain states are identified, the linear analog output is altered, thus causing the digital to analog converter to become non-linear. In an embodiment, the decoder circuitry and means for altering may be designed to add a first compensation value to the analog output when a first state is identified, a second compensation value when a second state is identified, and both of the compensation values when a third state is identified. The device may be implemented as a current source type of digital-to-analog converter or as a resistor ladder type of digital-to-analog converter. The altering means may be disabled for operation of the device as a linear digital-to-analog converter.

In another embodiment, the invention includes a method for processing a color intensity value in a computer graphics system in which graphics pre-processing has reduced the dynamic range of the color intensity values to a range that is less than the full input range of the DAC that drives the display. The color intensity value is scaled up by a non-integer greater than one in order to cause the dynamic range of the intensity value to more closely approximate the desired full input range of the DAC. This necessarily results in error, however, because scaling by a non-integer results in a product having both an integer portion and a fractional portion. A first analog output is generated that is proportional to the integer portion. The integer portion is also decoded, and a second analog output is generated responsive to the decoding. The second analog output represents the fractional portion. The first and second analog outputs are combined, and the combined analog output is used to drive a display device.

BRIEF DESCRIPTION OF THE DRAWINGS

The present invention is described herein with reference to the accompanying drawings. In the drawings, like reference numbers indicate identical or functionally similar elements. The left-most digit(s) of a reference number identifies the figure in which the reference number first appears.

FIG. 8 is a block diagram of a computer system having its graphics system configured to use non-linear digital-to-analog converters for error compensation according to a preferred embodiment of the invention.

FIG. 9 is a schematic diagram of a circuit for multiplying a number by $7/8$.

FIG. 10 is a schematic diagram of a circuit for multiplying a number by $3/4$.

DETAILED DESCRIPTION OF THE PREFERRED EMBODIMENTS

Figure 1:
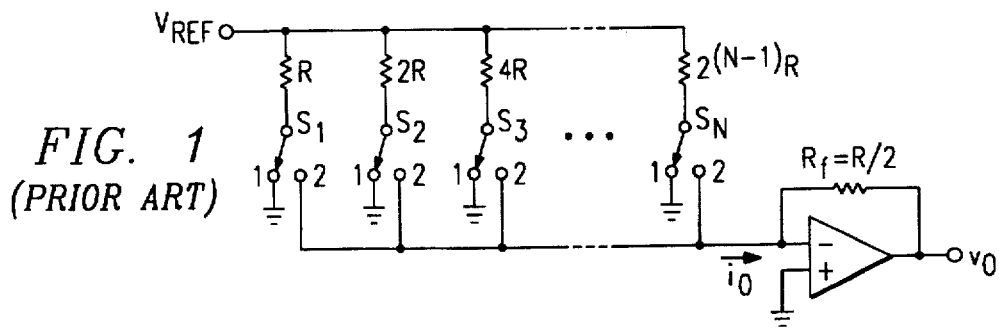
FIG. 1 is a schematic diagram of a prior art digital-to-analog converter of the resistor ladder type.

It is known that a linear DAC may be constructed in accordance with FIG. 1 using a ladder network of increasing resistances. To convert an 8-bit number to an analog voltage using this approach, eight resistors would be chosen (in addition to the feedback resistor $R_f$), each having a resistance equal to twice that of the resistor to its immediate left, and the leftmost resistor having a value twice that of $R_f$. In this manner, no decoding of the input data is necessary, and switches $S_{1-N}$ may be controlled by the individual bits of the input data byte. For each bit asserted, the corresponding switch will be closed, and a proportional voltage will be added to $v_0$ by the circuit so that the sum of all the individual contributions will represent an analog representation of the magnitude of the input data byte.

Figure 2:
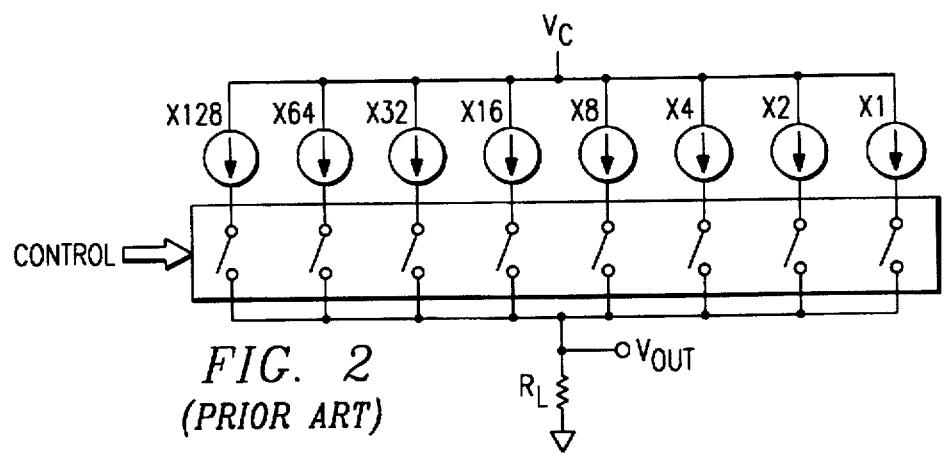
FIG. 2 is a schematic diagram of a first prior art digital-to-analog converter of the current source type.

It is also known that a linear DAC may be constructed using a series of current sources. As shown in FIG. 2, such a DAC is analogous to the DAC of FIG. 1 in that each of the current sources is designed to supply twice the current of its immediate neighbor. For conversion of an 8-bit number, each of the current sources may be configured to be switched on and off by one of the bits in the input data byte. For each bit in the input data that is asserted, the corresponding current source is turned on, and a proportional amount of current is sent through the load resistor $R_L$. The sum of the currents from all active current sources are summed in the load resistor and are converted to an output voltage $v_{out}$ according to Ohm's law, resulting in an analog representation of the magnitude of the input data byte.

Heretofore it has been believed that, in any digital system that uses a DAC to produce an analog output, the most precise results will be achieved by using a DAC that produces as linear an output as possible for all inputs. For this reason, one perceived difficulty with the designs of FIGS. 1 and 2 has been their inherent lack of precision. For example, in the designs of FIGS. 1 and 2, a transition from 127 to 128 involves switching off all seven of the least significant current sources (or resistor values) and turning on the single most significant current source (or resistor value) to replace them. Theoretically, the difference in magnitude between the single most significant current source (or resistor value) and the sum of the seven least significant current sources (or resistor values) will exactly correspond to the least significant increment of the DAC output. In practice, this result is very difficult to achieve because it is difficult to manufacture large current sources (or resistor values) so precisely. It has been recognized that precision is more easily achieved when transitions do not involve switching between units that have such large disparities in relative magnitude. This recognition led to the approach illustrated in FIG. 3.

Figure 3:
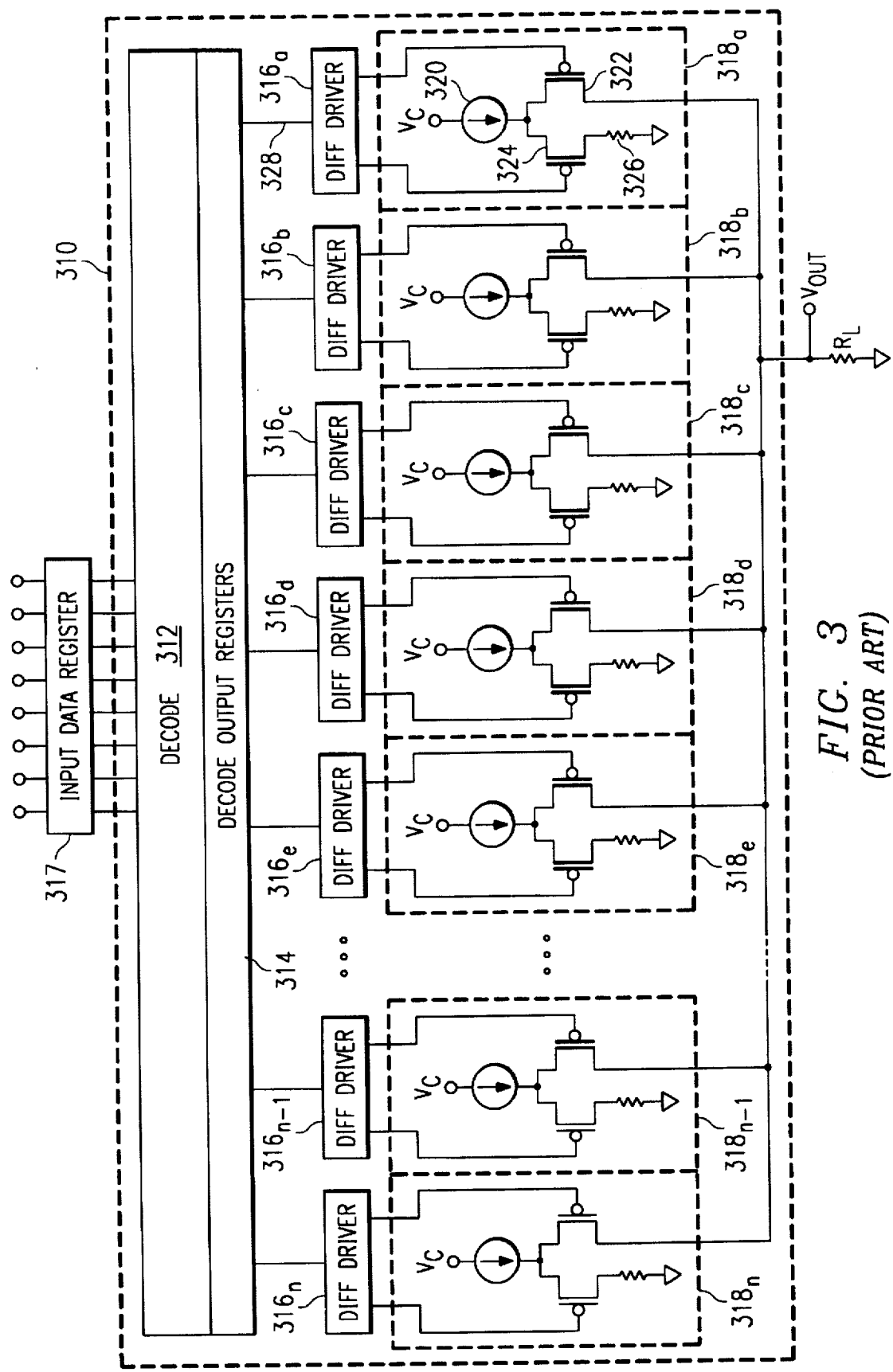
FIG. 3 is a schematic diagram of a second prior art digital-to-analog converter of the current source type.

In FIG. 3, DAC 310 includes a decoder 312, a set of decoder output registers 314, a set of differential drivers 316$_{a-n}$, and a set of unit current source modules 318$_{a-n}$. The input of decoder 312 is coupled to an input data register 317, which is in turn coupled to a source of input data (not shown). The output of DAC 310 is coupled to ground through a load resistor $R_L$. As was the case with the DAC of FIG. 2, load resistor $R_L$ sums the currents from the active unit current source modules 318$_{a-n}$ and converts them into an output voltage $v_{out}$ according to Ohm's law, resulting in an analog representation of the magnitude of the input data byte.

Within each unit current source module 318 is a unit current source 320, two p-channel transistors 322 and 324, and a "dump" resistor 326. In operation, each of the unit current sources 320 remains on at all times. Whenever decoder 312 asserts the control signal 328 for the differential driver 316 associated with one of the unit current source modules 318, the selected differential driver 316 turns on p-channel transistor 322 and turns off p-channel transistor 324, thus sending a unit current contribution through load resistor $R_L$. On the other hand, when the control signal 328 is unasserted, differential driver 316 changes states, turning off p-channel transistor 322 and turning on p-channel transistor 324, thus redirecting the current from unit current source 320 to ground through "dump" resistor 326.

By way of further background, it is known that decoder 312 may be designed such that some of the unit current source modules 318 are grouped in banks having an aggregate magnitude greater than the least significant current source but less than or equal to, say, sixteen of the unit sources. In this manner a decoding scheme may be implemented such that, as the input data byte value increments from 0 to 255, each of the current source banks is turned on incrementally to avoid the precision problems that are caused when many small sources are suddenly switched off and a larger source is switched on. This form of decoding is sometimes referred to as "thermometer" style decoding.

By way of still further background, the Electronic Industries Association has promulgated a well-known standard, known as standard RS343, for the operation of RGB display devices such as CRTs. This standard contemplates that three analog values, each having a range from 0 to 660.6 mV, will be used to specify color intensities for red, green and blue, respectively. Thus, if an 8-bit DAC were used to supply the required range of analog values for red, green or blue, it is known that the input range of 0–255 must correspond to the output range of 0–660.6 mV. This translates to a least significant increment (or least significant magnitude change) of 2.59 mV on the analog output of the DAC. In other words, if an 8-bit DAC according to FIG. 3 were used in an RS343 implementation, a change in the least significant bit of the input value supplied to the DAC should correspond to a change in the analog output of the DAC having a least significant magnitude—a change equal to 2.59 mV. Typically, the equivalent resistance of the monitor connection for each of the three channels R, G and B is 37.5 Ohms. Thus, the least significant change in the analog output, 2.59 mV, corresponds to a least significant unit of current equal to 69.1 microamps. Each of current sources 320, then, in the circuit of FIG. 3, should be designed to supply 69.1 microamps in order to be used in such an implementation. The RS343 standard also specifies that a blanking control signal (an analog signal) be superimposed on each of the R,G and B analog outputs, and that a sync control signal (also an analog signal) be superimposed on the G analog output.

Construction and Operation of a Non-Linear DAC

Figure 4:
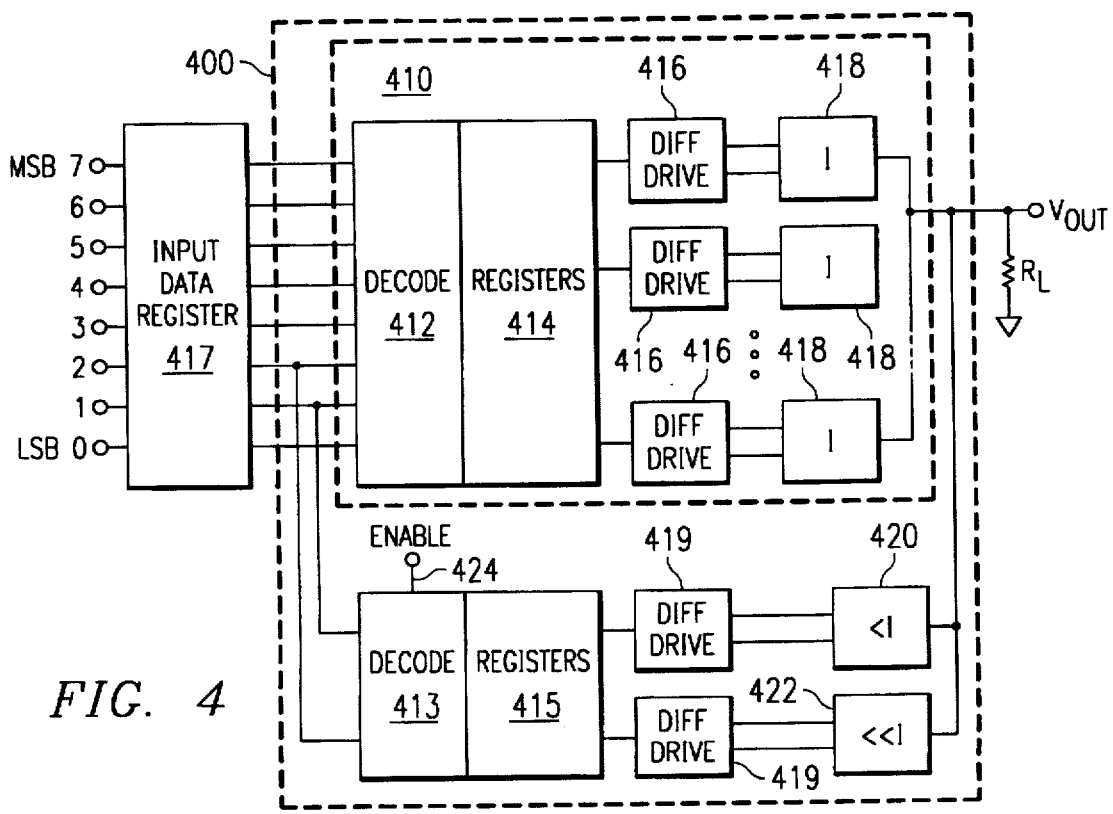
FIG. 4 is a schematic diagram of a non-linear digital-to-analog converter according to a preferred embodiment of the invention.

FIG. 4 is a schematic diagram of a non-linear DAC 400 constructed according to the invention. Non-linear DAC 400 includes a linear DAC 410 which is configured to receive an 8-bit data byte at its input, typically from an input data register 417. Linear DAC 410 is constructed according to the design of the circuit of FIG. 3 except that, preferably, instead of each p-channel transistor 324 being coupled to its own dump resistor 326, each p-channel transistor 324 is coupled to a dump bus (not shown). The dump bus, in turn, is coupled to ground on-chip through a single dump resistor 326. This layout accomplishes the same result as does the circuit of FIG. 3, but with fewer resistors. Decoder 412 is configured to control differential drivers 416 via control signals latched into decode output registers 414. (Decode output registers 414 prevent transient outputs during decoding from affecting the DAC output.) Differential drivers 416 control unit current source modules 418 in accordance with the description previously given of the circuit of FIG. 3. When selected, unit current source modules 418 each supply a current I to load resistor $R_L$. (In an RS343 implementation, I should be equal to 69.1 microamps.)

Nonlinear DAC 400 also includes a second decoder 413 and a second set of decoder output registers 415. The input of decoder 413 is coupled only to input data bits 1 and 2, bit 0 being the least significant bit of the input data byte. The outputs of decoder output registers 415 are coupled to the control inputs of differential drivers 419, which in turn operate current source modules 420 and 422. Current source modules 420 and 422 are constructed in accordance with current source modules 418, except that the magnitude of the current provided by each of modules 420 and 422 is less than the unit current I. (Also, as was just explained, the p-channel transistors within modules 420 and 422 that are coupled to ground through a dump resistor should preferably be coupled to the dump bus previously described, so as to be coupled to ground on-chip through a common dump resistor instead of through separate dump resistors.) The outputs of current source modules 420 and 422 act as compensation values, and are coupled to the outputs of current source modules 418. When modules 420 and 422 are selected, the currents provided by them will add to the currents already being provided to resistor $R_L$ by linear DAC 410. Thus, for all input values in which bits 1 and 2 correspond to decoded states, the otherwise-linear output of the DAC will be transformed into a nonlinear output by virtue of the added compensation values.

Decoder 413 is provided with an enable input 424. When decoder 413 is disabled, nonlinear DAC 400 behaves like a conventional linear DAC. When decoder 413 is enabled, however, DAC 400 behaves in the non-linear fashion just described.

Use of a Non-linear DAC for Error Compensation in a Computer Graphics System

Figure 5:
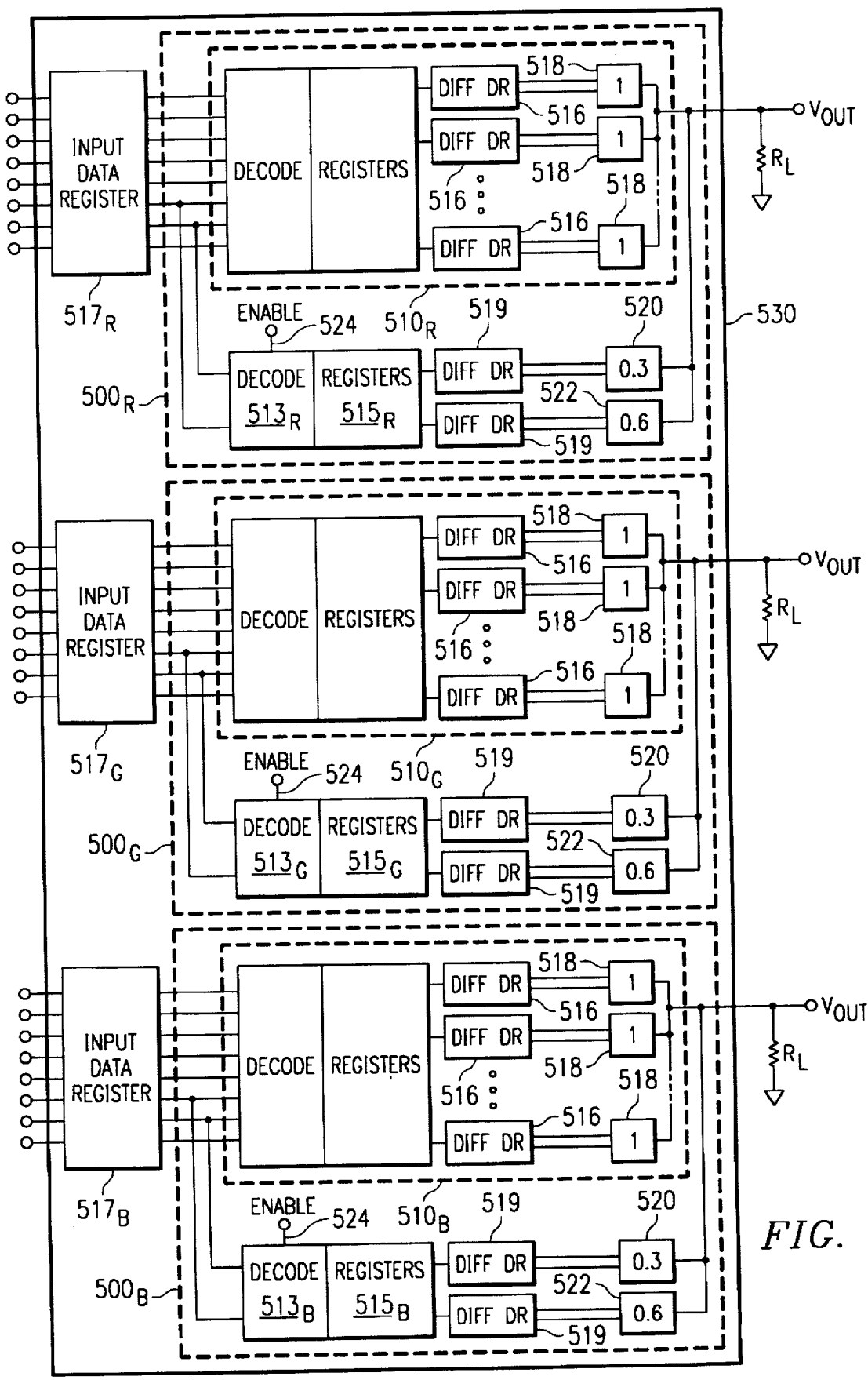
FIG. 5 is a schematic diagram of a non-linear RGB display system according to a preferred embodiment of the invention.

FIG. 5 is a schematic diagram of a non-linear RGB output system 530 configured to process color intensity values in a computer graphics system. In the configuration of FIG. 5, red, green and blue input data are supplied by a host processor or graphics system to input data registers $517_R$, $517_G$ and $517_B$, respectively. Load resistors $R_L$ correspond to the equivalent resistance presented by a CRT monitor connection (typically 37.5 Ohms). Non-linear RGB output system 530 includes three non-linear DACs $500_R$, $500_G$ and $500_B$, each having its input coupled to a corresponding input data register 517. Each of the non-linear DACs $500_R$, $500_G$ and $500_B$ is constructed in accordance with the previously-described non-linear DAC of FIG. 4 except that the specifics of the current source modules and decoders in FIG. 5 are as follows:

The magnitude of the current supplied by each of current source modules 518 should correspond to the magnitude of the least significant increment of the analog output, $V_{out}$. In other words, a change in the least significant bit of the input data byte should correspond to the activation or deactivation of one of the unit current sources 518, which in turn should cause an increase or decrease in analog output $V_{out}$ by a least significant increment. The magnitude of the current supplied by current source module 520, on the other hand, should equal 0.3 times the magnitude of the current supplied by each of current source modules 518; and that supplied by current source module 522 should equal 0.6 times that supplied by each of current source modules 518. In this manner, activating a current source module 520 will increase the corresponding analog output $V_{out}$ by 0.3 times the least significant increment. Similarly, activating a current source module 522 will increase the corresponding analog output $V_{out}$ by 0.6 times the least significant increment. Activating both of the current source modules 520 and 522 at the same time will increase the corresponding analog output $V_{out}$ by 0.9 times the least significant increment.

It will be understood by those skilled in the art that any RGB display system configured to drive a conventional monitor will also include such control signals as "SYNC" and "BLANK" (not shown in the drawings).

Figure 6:
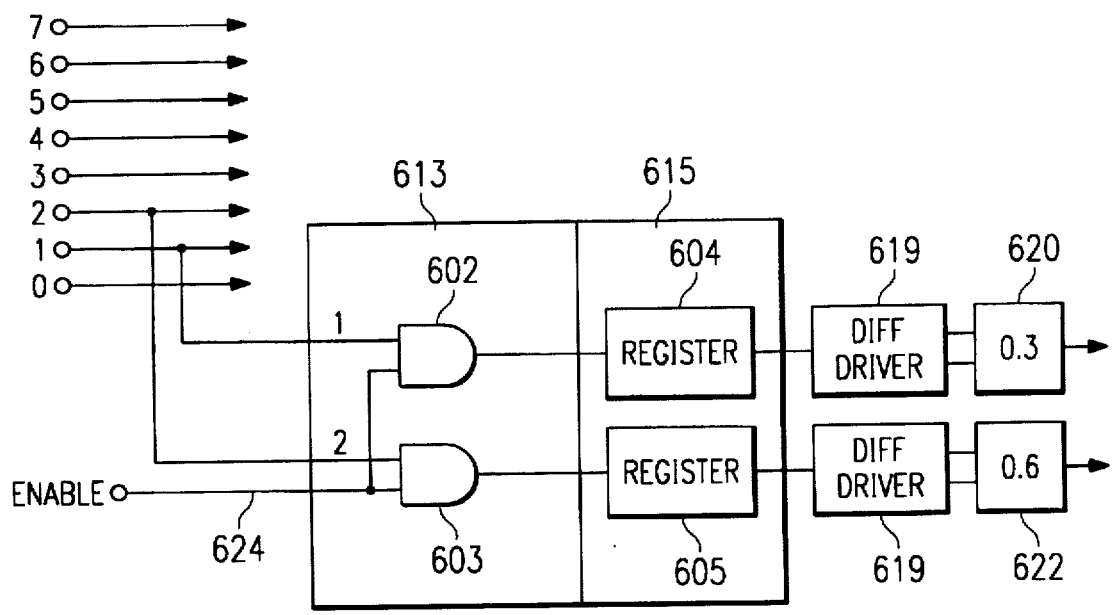
FIG. 6 is a schematic diagram of a preferred decoding scheme for the red and green non-linear digital-to-analog converters of FIG. 5.

FIG. 6 is a schematic diagram showing the preferred decoding scheme for non-linear DACs $510_R$ and $510_G$ in FIG. 5. Decoders $513_R$ and $513_G$ should be constructed according to decoder 613. Likewise, registers $515_R$ and $515_G$ should be constructed according to registers 615. Decoder 613 includes two AND gates 602 and 603, each AND gate having one input coupled to an enable signal 624. AND gate 602 has one input coupled to bit 1 of the input data byte. AND gate 603 has one input coupled to bit 2 of the input data byte. (Bit 0 of the input data byte is the least significant bit.) As can be seen from the drawing, the output of AND gate 602 controls current source module 620 via register 604 and a differential driver 619. The output of AND gate 603 controls current source module 622 via register 605 and another differential driver 619.

Figure 7:
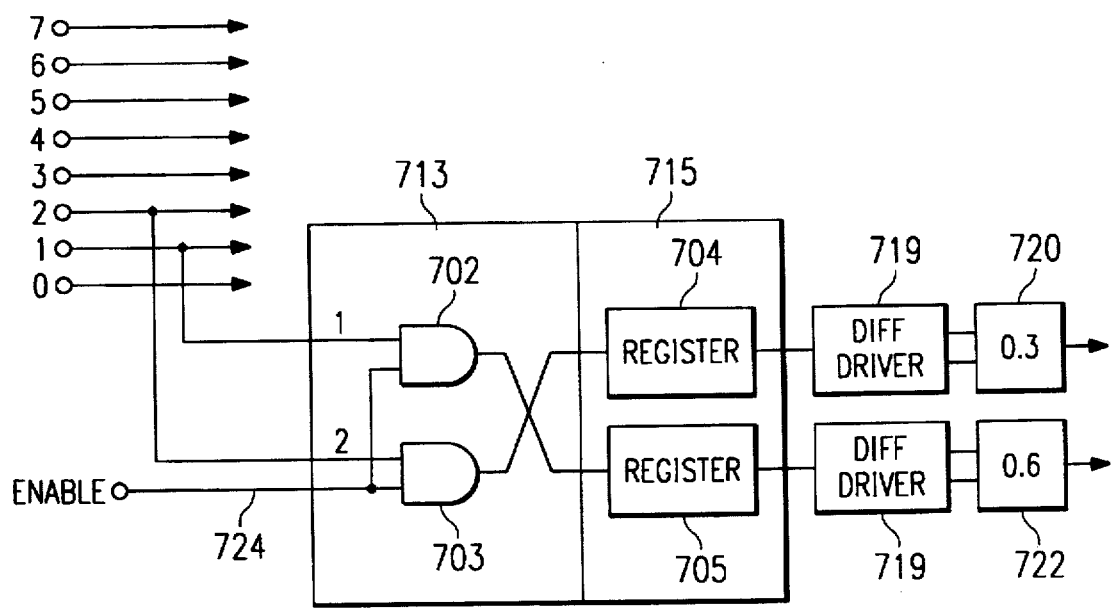
FIG. 7 is a schematic diagram of a preferred decoding scheme for the blue non-linear digital-to-analog converter of FIG. 5.

FIG. 7 is a schematic diagram showing the preferred decoding scheme for non-linear DAC $510_B$ in FIG. 5. Decoder $513_B$ should be constructed according to decoder 713. Likewise, registers $515_B$ should be constructed according to registers 715. Decoder 713 includes two AND gates 702 and 703, each AND gate having one input coupled to an enable signal 724. AND gate 702 has one input coupled to bit 1 of the input data byte. AND gate 703 has one input coupled to bit 2 of the input data byte. (Bit 0 of the input data byte is the least significant bit.) As can be seen from the drawing, the output of AND gate 702 controls current source module 722 via register 705 and a differential driver 719. The output of AND gate 703 controls current source module 720 via register 704 and another differential driver 719.

For convenience of reference, the following truth table is provided to show the preferred operation of decoders $513_{R, G \text{ and } B}$ and the respective current source modules 520 and 522 that they control:

TABLE 4

| Bit 2 of the Input Data Byte | Bit 1 of the Input Data Byte | Compensation Value for R and G | Compensation Value for B |
|---|---|---|---|
| 0 | 0 | 0 | 0 |
| 0 | 1 | 0.3 | 0.6 |
| 1 | 0 | 0.6 | 0.3 |
| 1 | 1 | 0.9 | 0.9 |

FIG. 8 illustrates a computer 800 having its graphics system configured to use non-linear DACs for error compensation. Non-linear RGB output system 830 drives the R, G and B inputs of monitor 828, and should be constructed in accordance with the non-linear RGB output system 530 that was previously described in relation to FIGS. 5–7. Host system 802 and graphics system interface 804 may be any computer system capable of producing color intensity values for use in a graphics display system; for example, host system 802 and graphics system interface 804 may be a conventional personal computer system or workstation with a graphics adapter. Frame buffer memory 814 in FIG. 8 is 8 bits deep and stores 3 bits of color intensity information per pixel for red, 3 bits per pixel for green, and 2 bits per pixel for blue ("3-3-2" format). Host system 802 and graphics system interface 804, on the other hand, supply 8-bits of color intensity per pixel for each of the red, green and blue channels (a total of 24 bits per pixel).

These three 8-bit values are supplied to scale-down systems 806, 807 and 808 as shown. The function of scale-down systems 806, 807 and 808 is to reduce the dynamic range of the color intensity values before dithering and truncation. (It has been found that compressing the information available in a color intensity value into a smaller dynamic range prior to dithering and truncation results in less information loss during the truncation process.) Preferably, scale-down systems 806 and 807 are constructed so as to scale the red and green input dynamic ranges by a factor of ⅞, and scale-down system 808 is constructed to scale the blue input dynamic range by a factor of ¾. Thus, the result of the scale-down process is to reduce the dynamic range for red and green from 0–255 to 0–223, and to reduce the dynamic range for blue from 0–255 to 0–191.

In practice, the scale-down function may be performed in software within host system 802 or graphics system interface 804. Alternatively, faster speeds may be achieved by performing the scale-down function in hardware by shifting and subtracting. FIG. 9 illustrates a circuit for shifting an input data byte three bits to the right and subtracting the shifted version from the original number, yielding a result equal to ⅞ times the original number. FIG. 10 illustrates a circuit for shifting an input data byte two bits to the right and subtracting the shifted version from the original number, yielding a result equal to ¾ times the original number.

Once the dynamic range of each channel has been reduced in the scale-down process, the color intensity values may be dithered and truncated by known methods as indicated in FIG. 8 at 810, 811 and 812. In the system of the drawing, the red and green values are truncated from 8 bits each to 3 bits, while the blue values are truncated from 8 bits to 2 bits. After dithering and truncation, the values are stored in frame buffer memory 814 in a 3-3-2 format, 8 bits per pixel. The pixel values are continually retrieved from frame buffer memory 814 and are supplied to pixel encoding processes 816, 817 and 818. Preferably, pixel encoding processes 816, 817 and 818 are implemented in accordance with the color recovery process described above. Note, however, that on the output of the color recovery processes, the dynamic range of the color intensities will remain somewhat compressed. For the reasons discussed above, red and green values have a dynamic range of 0–224, after color recovery, and blue values have a dynamic range of 0–192. (At this point in the process blue values are even only because, as was discussed above, they are shifted one bit to the left at the output of the color recovery filter so that their range will more closely approximate the desired range of 0–255.)

In the system of the invention, therefore, look-up tables 820, 821 and 822 are used in connection with non-linear DACs 824, 825 and 826 to map the compressed dynamic ranges back to a full dynamic range of 0–255 before they are supplied as inputs to non-linear RGB output system 830. Table 5 below specifies, in the "Look-Up Table Output" column, the values that are preferably used to implement look-up tables 820 and 821. The formula for computing the values in the output column of Table 5 is as follows: Look-Up Table Output (Address)=The Integer Portion of the Product (Address*8/7).

TABLE 5

Red and Green

| Address | Desired Value | Look-up Table Output Decimal | Look-up Table Output Binary | Uncompensated Error | Uncompensated Step Size | Compensation Value | Compensated DAC output | Compensated Error | Compensated Step Size |
|---|---|---|---|---|---|---|---|---|---|
| 0 | 0.000 | 0 | 00000000 | 0.000 | n/a | 0.0 | 0.0 | 0.000 | n/a |
| 1 | 1.143 | 1 | 00000001 | −0.143 | 1.0 | 0.0 | 1.0 | −0.143 | 1.0 |
| 2 | 2.286 | 2 | 00000010 | −0.286 | 1.0 | 0.3 | 2.3 | +0.014 | 1.3 |
| 3 | 3.429 | 3 | 00000011 | −0.429 | 1.0 | 0.3 | 3.3 | −0.129 | 1.0 |
| 4 | 4.571 | 4 | 00000100 | −0.571 | 1.0 | 0.6 | 4.6 | +0.029 | 1.3 |
| 5 | 5.714 | 5 | 00000101 | −0.714 | 1.0 | 0.6 | 5.6 | −0.114 | 1.0 |
| 6 | 6.857 | 6 | 00000110 | −0.857 | 1.0 | 0.9 | 6.9 | +0.043 | 1.3 |
| 7 | 8.000 | 8 | 00001000 | 0.000 | 2.0 | 0.0 | 8.0 | 0.000 | 1.1 |
| 8 | 9.143 | 9 | 00001001 | −0.143 | 1.0 | 0.0 | 9.0 | −0.143 | 1.0 |
| 9 | 10.286 | 10 | 00001010 | −0.286 | 1.0 | 0.3 | 10.3 | +0.014 | 1.3 |
| 10 | 11.429 | 11 | 00001011 | −0.429 | 1.0 | 0.3 | 11.3 | −0.129 | 1.0 |
| 11 | 12.571 | 12 | 00001100 | −0.571 | 1.0 | 0.6 | 12.6 | +0.029 | 1.3 |
| 12 | 13.714 | 13 | 00001101 | −0.714 | 1.0 | 0.6 | 13.6 | −0.114 | 1.0 |
| 13 | 14.457 | 14 | 00001110 | −0.857 | 1.0 | 0.9 | 14.9 | +0.043 | 1.3 |
| 14 | 16.000 | 16 | 00010000 | 0.000 | 2.0 | 0.0 | 16.0 | 0.000 | 1.1 |
| . | . | . | . | . | . | . | . | . | . |
| . | . | . | . | . | . | . | . | . | . |
| 222 | 253.714 | 253 | 11111101 | −0.714 | 1.0 | 0.6 | 253.6 | −0.114 | 1.0 |
| 223 | 254.857 | 254 | 11111110 | −0.857 | 1.0 | 0.9 | 254.9 | +0.043 | 1.3 |
| 224 | 256.000 | 255 | 11111111 | −1.000 | 1.0 | 0.9 | 255.9 | −0.100 | 1.0 |
| . | . | . | . | | | | | | |
| . | . | . | . | | | | | | |

TABLE 5-continued

Red and Green

| Address | Desired Value | Look-up Table Output Decimal | Look-up Table Output Binary | Uncompensated Error | Uncompensated Step Size | Compensation Value | Compensated DAC output | Compensated Error | Compensated Step Size |
|---|---|---|---|---|---|---|---|---|---|
| . | . | . | | | | | | | |
| 255 | | 255 | 11111111 | | | | | | |

```
        ↑  ↑
        |  |
       Bit2 Bit1
       Decoded
       Bits
```

As can be seen in Table 5, the look-up table outputs for addresses 225–255 may all be fixed as 255's or don't cares for use in the system described above, because the color recovery outputs (and thus the look-up table inputs) for red and green should not exceed 224.

Table 6 below specifies, in the "Look-Up Table Output" column, the values that are preferably used to implement look-up table 822. The formula for computing the values in the output column of Table 6 is as follows: Look-Up Table Output (Address)=The Integer Portion of the Product (Translated Address*4/3). The term "Translated Address" in Table 6 refers to the fact that the output of blue color recovery, which has a dynamic range from 0–96 as previously explained, has been shifted one bit to the left to double the range from 0–96 to 0–192.

TABLE 6

Blue

| Input | Translated Address | Desired Value | Look-up Tabb Output Decimal | Look-up Tabb Output Binary | Uncompensated Error | Uncompensated Step Size | Compensation Value | Compensated DAC output | Compensated Error | Compensated Step Size |
|---|---|---|---|---|---|---|---|---|---|---|
| 0 | 0 | 0.000 | 0 | 00000000 | 0.000 | n/a | 0.0 | 0.0 | 0.000 | n/a |
|   | 1 |   |   |   |   |   |   |   |   |   |
| 1 | 2 | 2.667 | 2 | 00000010 | −0.667 | 2 | 0.6 | 2.6 | 0.067 | 2.6 |
|   | 3 |   |   |   |   |   |   |   |   |   |
| 2 | 4 | 5.333 | 5 | 00000101 | −0.333 | 3 | 0.3 | 5.3 | 0.033 | 2.7 |
|   | 5 |   |   |   |   |   |   |   |   |   |
| 3 | 6 | 8.000 | 8 | 00001000 | 0.000 | 3 | 0.0 | 8.0 | 0.000 | 2.7 |
|   | 7 |   |   |   |   |   |   |   |   |   |
| 4 | 8 | 10.667 | 10 | 00001010 | −0.667 | 2 | 0.6 | 10.6 | 0.067 | 2.6 |
|   | 9 |   |   |   |   |   |   |   |   |   |
| 5 | 10 | 13.333 | 13 | 00001101 | −0.333 | 3 | 0.3 | 13.3 | 0.033 | 2.7 |
|   | 11 |   |   |   |   |   |   |   |   |   |
| 6 | 12 | 16.000 | 16 | 00010000 | 0.000 | 3 | 0.0 | 16.0 | 0.000 | 2.7 |
|   | 13 |   |   |   |   |   |   |   |   |   |
| 7 | 14 | 18.667 | 18 | 00010010 | −0.667 | 2 | 0.6 | 18.6 | 0.067 | 2.6 |
|   | 15 |   |   |   |   |   |   |   |   |   |
| 8 | 16 | 21.333 | 21 | 00010101 | −0.333 | 3 | 0.3 | 21.3 | 0.033 | 2.7 |
|   | 17 |   |   |   |   |   |   |   |   |   |
| 9 | 18 | 24.000 | 24 | 00011000 | 0.000 | 3 | 0.0 | 24.0 | 0.000 | 2.7 |
|   | 19 |   |   |   |   |   |   |   |   |   |
| 10 | 20 | 26.667 | 26 | 00011010 | −0.667 | 2 | 0.6 | 26.6 | 0.067 | 2.6 |
|   | 21 |   |   |   |   |   |   |   |   |   |
| 11 | 22 | 29.333 | 29 | 00011101 | −0.333 | 3 | 0.3 | 29.3 | 0.033 | 2.7 |
|   | 23 |   |   |   |   |   |   |   |   |   |
| 12 | 24 | 32.000 | 32 | 00100000 | 0.000 | 3 | 0.0 | 32.0 | 0.000 | 2.7 |
| . | . | . | . | . | . | . | . | . | . | . |
| 15 | 190 | 253.373 | 253 | 11111101 | −0.333 | 3 | 0.3 | 253.3 | 0.033 | 2.7 |
|   | 191 |   |   |   |   |   |   |   |   |   |
|   | 192 | 256.000 | 255 | 11111111 | 1.000 | 2 | 0.9 | 255.9 | 0.100 | 2.6 |
| . | . | . | . | . |   |   |   |   |   |   |
|   | 255 |   | 255 | 1111111 |   |   |   |   |   |   |

TABLE 6-continued

| | | Look-up Tabb Output | | | | | | | Com- |
|---|---|---|---|---|---|---|---|---|---|
| | Translated | Desired | | | Uncompensated | Uncompensated | Compensation | Compensated | Compensated | pensated |
| Input | Address | Value | Decimal | Binary | Error | Step Size | Value | DAC output | Error | Step Size |

Blue

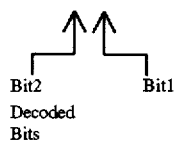

Bit2  Bit1
Decoded
Bits

As can be seen in Table 6, the look-up table outputs for addresses 193–255 may all be fixed as 255's or don't cares for use in the system described above, because the color recovery outputs (and thus the look-up table inputs) for blue should not exceed 192.

The theory of operation for the system of FIG. 8 will now be explained with reference first to Table 5 and then to Table 6.

Referring to Table 5, the numbers in the "Desired Value" column represent the exact product of (Address)(8/7). Because only integers are stored in the look-up table, many of the values in the "Look-Up Table Output" are in error because the fractional portion of the result has been suppressed. This error is reported in the column marked "Uncompensated Error." If the values in the "Look-Up Table Output" column were fed to the input of a linear DAC to drive an RGB monitor, then this error would be reflected in the display, and the step sizes would be as reported in the column marked "Uncompensated Step Size." As can be seen, the step sizes would vary from 1.0 to 2.0. Step size differences of this magnitude in a graphics display can readily be detected by the human eye.

The numbers in the column marked "Compensation Value" follow the truth table shown in Table 4. For red and green, the operation of decoders $513_{R\ and\ G}$ (and the respective current source modules 520 and 522 that they control) is such that a compensation value of 0.3 times the least significant DAC increment will be added to the DAC output whenever bit 1 of the look-up table output is asserted. Whenever bit 2 of the look-up table output is asserted, a compensation value of 0.6 times the least significant DAC increment will be added to the DAC output. Whenever both of bits 1 and 2 of the look-up table output are asserted, the compensation values of 0.3 and 0.6 are both added to the DAC output at the same time, thus creating an aggregate compensation value of 0.9. The column marked "Compensated DAC Output" reports the final outputs of the non-linear DAC after the compensation values have been added. As can be seen by comparing the column marked "Compensated Error" with the column marked "Uncompensated Error," the output of the non-linear DAC is much closer to the desired values than those of the look-up table (which would correspond to the outputs of a linear DAC). The total compensated sum-of-squares error for Table 5 over the entire range of interest (inputs 0–224) is approximately 1.7, whereas the total sum-of-squares error for the uncompensated case would have been 59.4. In addition, the "Compensated Step Size" column shows that the minimum step size for the system of the invention is 1.0, and the maximum step size is only 1.3, a difference of only 0.3. Step size differentials this small in a graphics display are very difficult for the human eye to detect. Moreover, these results have been accomplished in an 8-bit system without adding all of the size, expense and complexity of an 11 or 12-bit linear DAC.

The results shown in Table 6 are analogous to those of Table 5. The "Uncompensated Error" column reports the difference between the "Look-Up Table Output" and the "Desired Value." As can be seen in the "Uncompensated Step Size" column, the uncompensated step size varies from 2 to 3, a difference of 1.0. The column marked "Compensation Value" follows the truth table of Table 4: For blue, whenever bit 1 of the look-up table output is asserted, a compensation value equal to 0.6 times the least significant DAC increment will be added to the DAC output. Whenever bit 2 of the look-up table output is asserted, a compensation value equal to 0.3 times the least significant DAC increment will be added to the DAC output. (In this example, the pattern in which both bits 1 and 2 are asserted at the output of the look-up table does not occur on the blue channel.) As can be seen by comparing the column marked "Compensated Error" with the column marked "Uncompensated Error," the output of the non-linear DAC is much closer to the desired values than those of the look-up table (which would correspond to the outputs of a linear DAC). The total compensated sum-of-squares error for Table 6 over the entire range of interest (inputs 0–192) is approximately 0.178, whereas the sum-of-squares error over the same range for the uncompensated case would have been 30.15. The minimum step size for the system of the invention is 2.6, and the maximum step size is 2.7, a difference of only 0.1. And again, these results have been accomplished in an 8-bit system without adding all of the size, expense and complexity of an 11 or 12-bit linear DAC.

It will now also be appreciated how the enable inputs 524 to decoders $513_{R,\ G\ and\ B}$ provide non-linear RGB output system 530 with additional flexibility: They enable non-linear RGB output system 530 to operate in two different modes, and thus enable non-linear RGB output system 530 to be used in a computer graphics system that does not employ dithering and color recovery. For example, by disabling decoders $513_{R,\ G\ and\ B}$, non-linear RGB output system 530 will behave like a linear RGB output system and may be used to process "true color" intensity values (which do not need to be scaled up or down prior to display, as their dynamic range goes from 0–255 by definition). Also, non-linear RGB output system 530 may be used in a computer graphics system that switches alternately between "true color" mode and color recovery mode during normal operation. In such a system, decoders $513_{R,\ G\ and\ B}$ would be disabled while the system operates in "true color" mode, and enabled while the system operates in color recovery mode.

While the present invention has been described in detail in relation to various preferred embodiments thereof, it should be understood that the described embodiments have been presented by way of example only, and not by way of limitation. It will be understood by those skilled in the art that various changes may be made in the form and details of the embodiments without departing from the spirit and scope of the invention as defined in the appended claims and their equivalents.

For example, it should be noted that the compensation values of 0.3 and 0.6 were chosen to be the same for all three channels of the above embodiment, red, green and blue. As can be observed from the numbers reported in Tables 5 and 6, an even more precise result might be obtained by choosing different compensation values for blue than for red and green, and/or by decoding more than two bits of the output of the look-up table. It is believed, however, that such an optimization would involve trade-offs. Specifically, use of the same values for all three channels achieves an economy of scale in the manufacturing process; and decoding two bits rather than three or more bits significantly reduces the complexity of the decoding logic. In the embodiment described above, the compensation values were arrived at by iteratively choosing various compensation values and computing the results for red, green and blue; then by choosing further sets of compensation values and comparing the results. The values yielding the least overall error for red, green and blue with the most uniform step size were ultimately favored. (For example, the compensation values 0.25 and 0.50 were tried first, then the values ⅓ and ⅔. Finally, the values 0.3 and 0.6 were tried and accepted.)

It should also be noted that non-linear DACs according to the invention may be used to compensate for errors in computer graphics systems using other than a 3-3-2 format in the frame buffer, and other than a color recovery system as above described. (For example, the dynamic range of color intensity values on the output of a given color recovery system may vary from those shown in FIG. 8, and a given frame buffer may store information in a 4-4-4 format instead of a 3-3-2 format.) By altering the compensation values produced by the non-linear RGB output system and altering the scaling factors used in the scale-down processes and look-up tables, the embodiments described above may readily be applied to such alternative systems.

Moreover, it should be noted that the invention may be used equally well in monochrome or black and white computer graphics systems as in color computer graphics systems. The invention may also be used to compensate for error in applications other than computer graphics systems.

What is claimed is:

1. A method for producing an analog output that represents an approximation of the result of scaling a digital input value by a non-integer, said method comprising the steps of:

generating an integer output value, said integer output value representing the integer portion of the result of multiplying said digital input value by said non-integer;

producing a linear analog output responsive to all bits of said integer output value;

decoding at least one bit of said integer output value; and adding, responsive to said decoding step, a first compensation value to said linear analog output, said first compensation value representing the fractional portion of the result of multiplying said digital input value by said non-integer.

2. The method of claim 1, wherein said decoding step comprises decoding for at least first and second states; and wherein said adding step further comprises adding said first compensation value to said analog output when said first state is decoded and adding a second compensation value to said analog output when said second state is decoded.

3. The method of claim 2, wherein a change in the least significant bit of said integer output value corresponds to a change in said linear analog output having a least significant magnitude; and wherein the magnitudes of said first and second compensation values are each less than said least significant magnitude.

4. The method of claim 3, wherein the only bits of said integer output value that are decoded during said decoding step are bits 1 and 2, the least significant bit of said integer output value being bit 0.

5. The method of claim 4, wherein said non-integer is 8/7; wherein said first state is decoded when bit 1 is asserted and bit 2 is unasserted; and wherein said second state is decoded when bit 2 is asserted and bit 1 is unasserted.

6. The method of claim 5, wherein said decoding step further comprises decoding a third state when both of bits 1 and 2 are asserted; and wherein said adding step further comprises adding both of said first and second compensation values to said analog output when said third state is decoded.

7. The method of claim 6, wherein the magnitude of said first compensation value is approximately equal to 0.3 times said least significant magnitude; and wherein the magnitude of said second compensation value is approximately equal to 0.6 times said least significant magnitude.

8. The method of claim 5, wherein the magnitude of said first compensation value is approximately equal to 0.3 times said least significant magnitude; and wherein the magnitude of said second compensation value is approximately equal to 0.6 times said least significant magnitude.

9. The method of claim 4, wherein said non-integer is 4/3; wherein said first state is decoded when bit 2 is asserted and bit 1 is unasserted; and wherein said second state is decoded when bit 1 is asserted and bit 2 is unasserted.

10. The method of claim 9, wherein the magnitude of said first compensation value is approximately equal to 0.3 times said least significant magnitude; and wherein the magnitude of said second compensation value is approximately equal to 0.6 times said least significant magnitude.

11. The method of claim 1, further comprising the steps of sensing the state of a binary enable input;

disabling said adding step when said binary enable input is sensed to be at one assertion level; and enabling said adding step when said binary enable input is sensed to be at the other assertion level.

12. The method of claim 1, wherein said linear analog output is an output current, wherein said first compensation value is a first compensation current, and wherein said adding step comprises selectively adding said first compensation current to said output current.

13. The method of claim 1, wherein said linear analog output is an output voltage, wherein said first compensation value is a first compensation voltage, and wherein said adding step comprises selectively adding said first compensation voltage to said output voltage.

14. The method of claim 1, wherein said generating step comprises retrieving, responsive to said digital input value, said integer output value from a look-up table.

15. Apparatus for digital-to-analog conversion of an n-bit input, said apparatus comprising:

means for producing a linear analog output responsive to all n bits of said n-bit input;

decoder circuitry coupled to at least one of the n bits of said n-bit input, said decoder circuitry having a decoder output; and means for altering said linear analog output responsive to said decoder output;

wherein said decoder circuitry is capable of decoding for at least first and second states; and wherein said means for altering said analog output comprises circuitry for selectively adding a first compensation value to said analog output when said first state is decoded and adding a second compensation value to said analog output when said second state is decoded.

16. The apparatus of claim 15, wherein said decoder circuitry is further capable of decoding for a third state; and wherein said means for altering said analog output further comprises circuitry for adding both of said first and second compensation values to said analog output when said third state is decoded.

17. The apparatus of claim 16, wherein said decoder circuitry has first and second decoder inputs coupled to bits 1 and 2 of said n-bit input, respectively, bit 0 of said n-bit input being the least significant bit of said n-bit input;

wherein said first state is decoded when bit 1 is asserted and bit 2 is unasserted;

wherein said second state is decoded when bit 2 is asserted and bit 1 is unasserted; and wherein said third state is decoded when bits 1 and 2 are both asserted.

18. The apparatus of claim 17, wherein the magnitude of said first compensation value is approximately equal to 0.3 times said least significant magnitude; and wherein the magnitude of said second compensation value is approximately equal to 0.6 times said least significant magnitude.

19. The apparatus of claim 16, wherein a change in the least significant bit of said n-bit input corresponds to a change in said linear analog output having a least significant magnitude;

wherein the magnitude of said first compensation value is approximately equal to 0.3 times said least significant magnitude; and wherein the magnitude of said second compensation value is approximately equal to 0.6 times said least significant magnitude.

20. The apparatus of claim 15, wherein said decoder circuitry has first and second decoder inputs coupled to bits 1 and 2 of said n-bit input, respectively, bit 0 of said n-bit input being the least significant bit of said n-bit input;

wherein said first state is decoded when bit 2 is asserted and bit 1 is unasserted; and wherein said second state is decoded when bit 1 is asserted and bit 2 is unasserted.

21. The apparatus of claim 20, wherein a change in the least significant bit of said n-bit input corresponds to a change in said linear analog output having a least significant magnitude; and wherein the magnitudes of said first and second compensation values are each less than said least significant magnitude.

22. The apparatus of claim 21, wherein the magnitude of said first compensation value is approximately equal to 0.3 times said least significant magnitude; and wherein the magnitude of said second compensation value is approximately equal to 0.6 times said least significant magnitude.

23. The apparatus of claim 15, wherein said decoder circuitry has first and second decoder inputs coupled to bits 1 and 2 of said n-bit input, respectively, bit 0 of said n-bit input being the least significant bit of said n-bit input;

wherein said first state is decoded when bit 1 is asserted and bit 2 is unasserted; and wherein said second state is decoded when bit 2 is asserted and bit 1 is unasserted.

24. The apparatus of claim 23, wherein a change in the least significant bit of said n-bit input corresponds to a change in said linear analog output having a least significant magnitude; and wherein the magnitudes of said first and second compensation values are each less than said least significant magnitude.

25. The apparatus of claim 15, further comprising circuitry for enabling and disabling, responsive to a binary enable input, said means for altering said linear analog output.

26. A method for processing a color intensity value in a computer graphics system that uses a digital-to-analog converter to drive a display device, said computer graphics system of the type in which the dynamic range of color intensity values is reduced during pre-processing such that the reduced dynamic range is less than the full range of inputs required to drive the digital-to-analog converter over its full output range, said method comprising the steps of:

generating a digital integer output value that represents the integer portion of the result of scaling said color intensity value by a non-integer greater than 1;

generating a first analog output that is proportional to said digital integer output value;

decoding at least one bit of said digital integer output value;

generating, responsive to said decoding step, a second analog output that is approximately proportional to the fractional portion of the result of scaling said color intensity value by said non-integer greater than 1;

combining said first and second analog outputs to produce a combined analog output; and communicating said combined analog output to the display device.

27. The method of claim 26, further comprising the steps of:

sensing the state of a binary enable input;

disabling said step of generating said second analog output when said binary enable input is sensed to be at one assertion level; and enabling said step of generating said second analog output when said binary enable input is sensed to be at the other assertion level.

28. Apparatus for producing an analog output with correction for quantization error introduced during digital data processing, said apparatus comprising:

first and second digital to analog converter circuitries;

a data path for communicating a digital value to the input of said first digital to analog converter circuitry; and decoder circuitry having a decoder circuitry input coupled to at least one of the bits of said data path, and having a decoder circuitry output;

wherein the input of said second digital to analog converter circuitry is coupled to said decoder circuitry output, and wherein the analog output is proportional to the sum of the outputs of said first and second digital to analog converter circuitries, the output of said second digital to analog conversion circuitry representing correction for the quantization error.

29. A method for producing an analog output with correction for quantization error introduced during digital data processing, said method comprising the steps of:

communicating a digital value having quantization error to the input of first digital to analog converter circuitry;

communicating at least one of the bits of said digital value having quantization error to the input of decoder circuitry;

communicating the output of said decoder circuitry to the input of second digital to analog converter circuitry; and summing the outputs of said first and second digital to analog converter circuitries, the output of said second digital to analog converter circuitry representing correction for the quantization error.

* * * * *

UNITED STATES PATENT AND TRADEMARK OFFICE
CERTIFICATE OF CORRECTION

PATENT NO. : 5,757,298
DATED : May 26, 1998
INVENTOR(S) : Robert B. Manley; David L. McAllister It is certified that error appears in the above-identified patent and that said Letters Patent is hereby corrected as shown below:

Column 1, Line 16, delete "*modem*" and insert therefor -- *modern* --;

Column 12, Table 5, In Address 13 delete "*14.457*" insert -- *14.857* --;

Column 13, Table 6, In Input delete "*15*" and insert therefor -- *95* --;

Column 13, Table 6, In Desired Value delete " *253.373*" and insert therefor -- *253.333* --.

Signed and Sealed this

First Day of May, 2001

Attest:

NICHOLAS P. GODICI

Attesting Officer     Acting Director of the United States Patent and Trademark Office